United States Patent [19]
Imai

[11] Patent Number: 5,648,279
[45] Date of Patent: Jul. 15, 1997

[54] METHOD OF MANUFACTURING BIPOLAR TRANSISTOR HAVING EMITTER REGION AND EXTERNAL BASE REGION FORMED IN SELF ALIGNMENT MANNER

[75] Inventor: Kiyotaka Imai, Tokyo, Japan

[73] Assignee: NEC Corporation, Tokyo, Japan

[21] Appl. No.: 491,719

[22] Filed: Jun. 19, 1995

[30] Foreign Application Priority Data

Jun. 21, 1994 [JP] Japan .................................. 6-138844

[51] Int. Cl.⁶ .................................................. H01L 21/265
[52] U.S. Cl. ........................ 437/31; 437/59; 148/DIG. 9; 148/DIG. 10; 148/DIG. 11
[58] Field of Search .................. 437/31, 59; 148/DIG. 9, 148/DIG. 10, DIG. 11

[56] References Cited

U.S. PATENT DOCUMENTS

| | | | |
|---|---|---|---|
| 4,735,911 | 4/1988 | Schaber | 437/33 |
| 5,204,276 | 4/1993 | Nakajima et al. | 437/31 |
| 5,296,391 | 3/1994 | Sato et al. | 437/31 |
| 5,424,227 | 6/1995 | Dietrich et al. | 437/31 |
| 5,432,104 | 7/1995 | Sato | 148/DIG. 10 |
| 5,439,833 | 8/1995 | Hebert et al. | 437/31 |

FOREIGN PATENT DOCUMENTS

| | | | |
|---|---|---|---|
| 283167 | 12/1986 | Japan | 437/31 |
| 3-214663 | 9/1991 | Japan . | |

*Primary Examiner*—John Niebling
*Assistant Examiner*—Long Pham
*Attorney, Agent, or Firm*—Young & Thompson

[57] ABSTRACT

In a method of manufacturing a bipolar transistor, a collector region having a first portion and a second portion around the first portion is covered with an insulating film and a polysilicon layer is formed on the insulating film, the polysilicon layer having an opening. The insulating film is then selectively removed about an area that is larger than the area of the opening to thereby expose the first and second portions of the collector region and form a gap between a part of the polysilicon layer and the second portion of the collector region. The gap is then filled with a silicon layer and impurities are doped to form an intrinsic base region in the first portion, followed by forming a side wall space to make the opening smaller than the original area. Other impurities are then doped to form an emitter region in said intrinsic base region, and further, still other impurities are doped into the collector region through the silicon layer to form an external base region, in contact with the intrinsic base region.

2 Claims, 16 Drawing Sheets

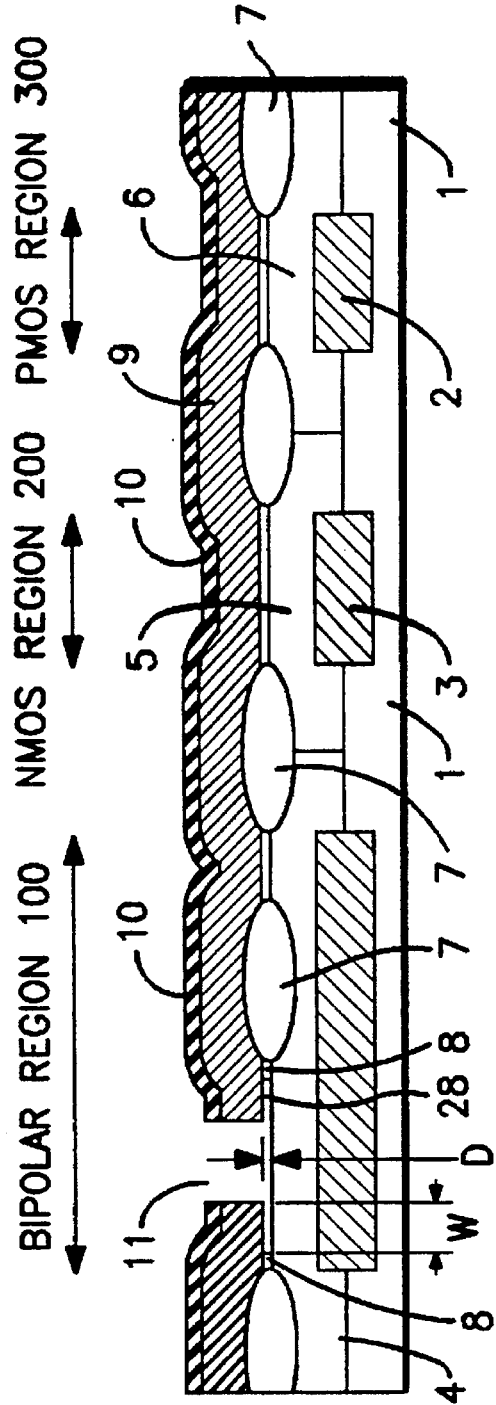
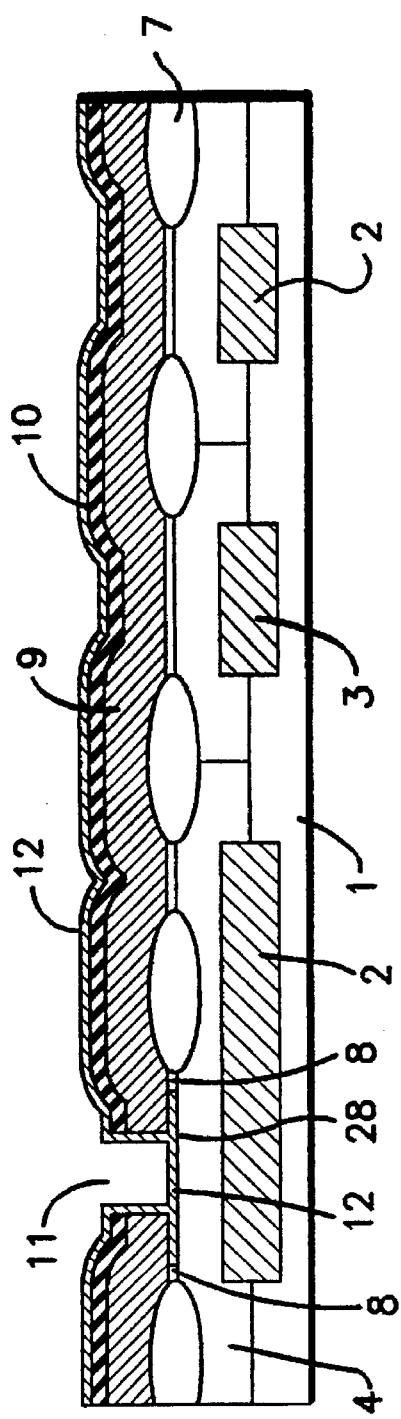
FIG. 4C
FIG. 4D

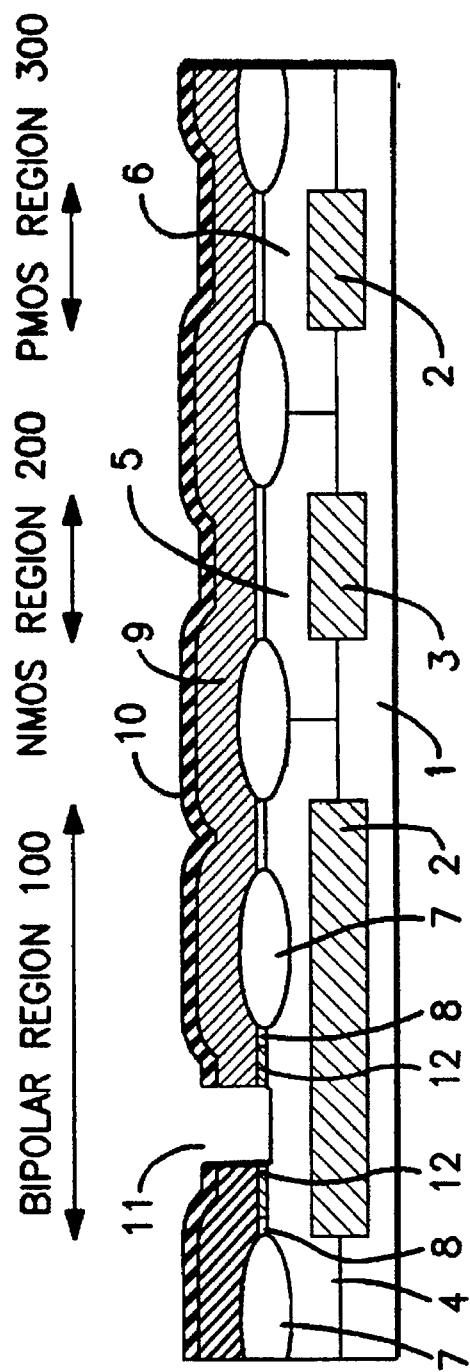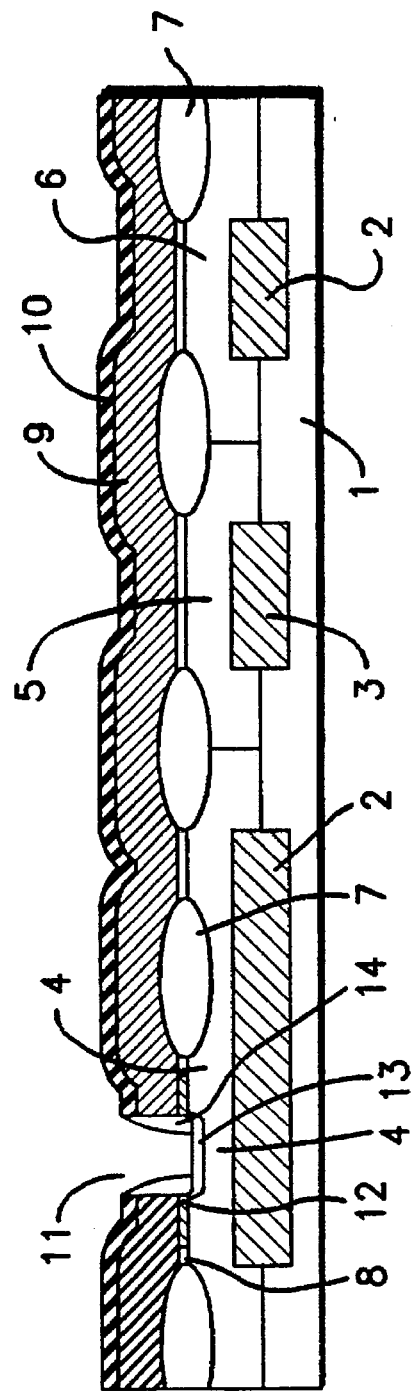
FIG. 4E
FIG. 4F

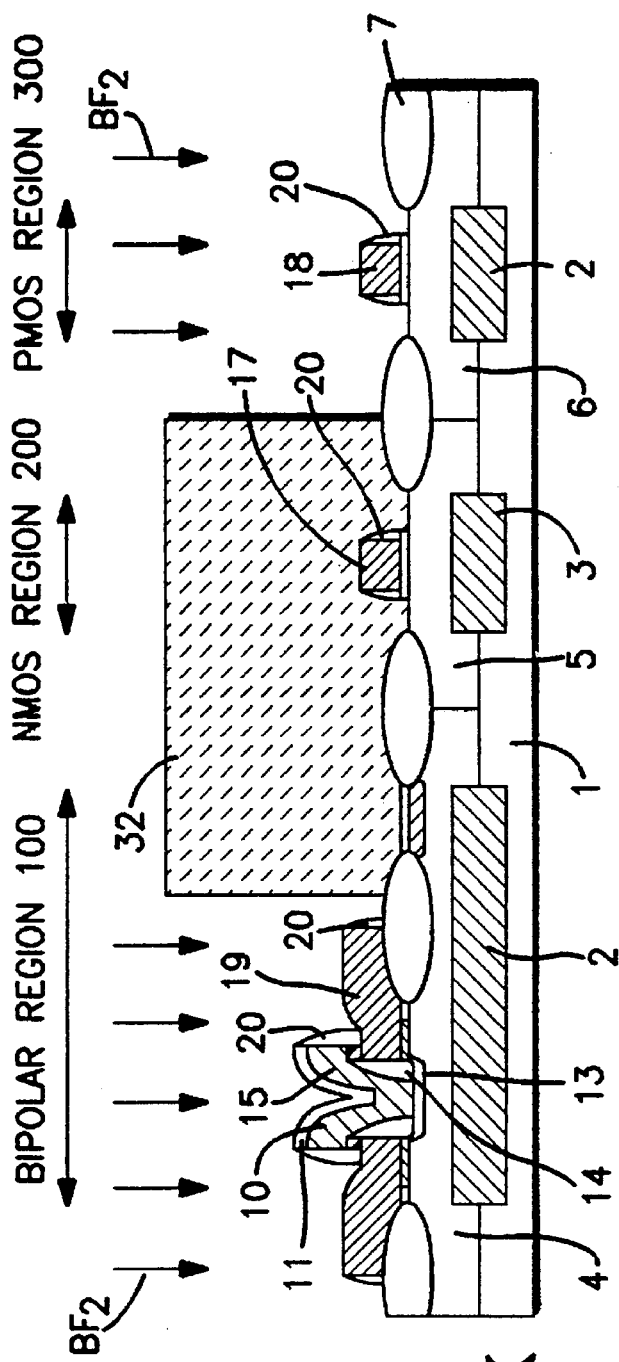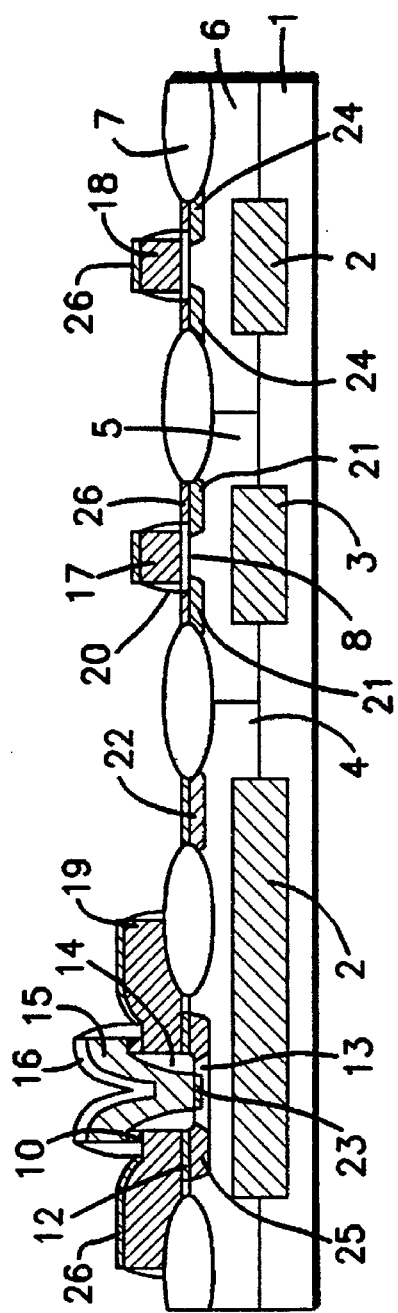
FIG. 4K
FIG. 4L

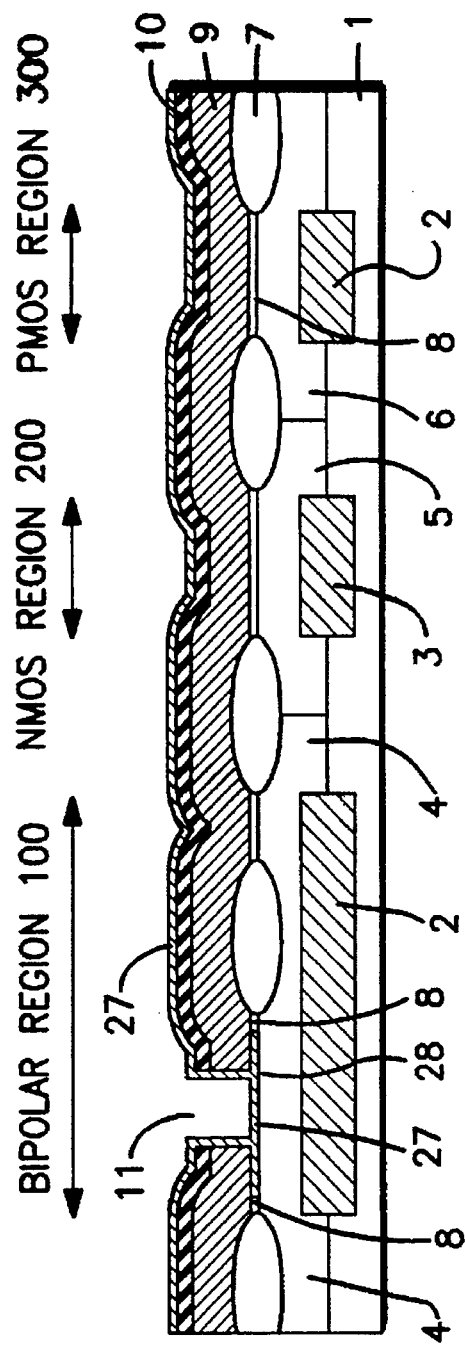
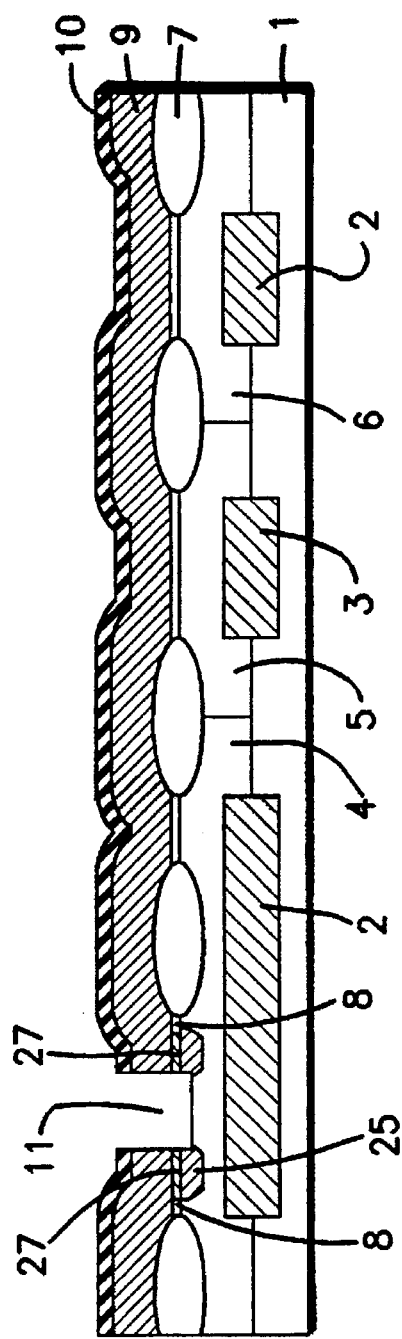
FIG. 5A
FIG. 5B

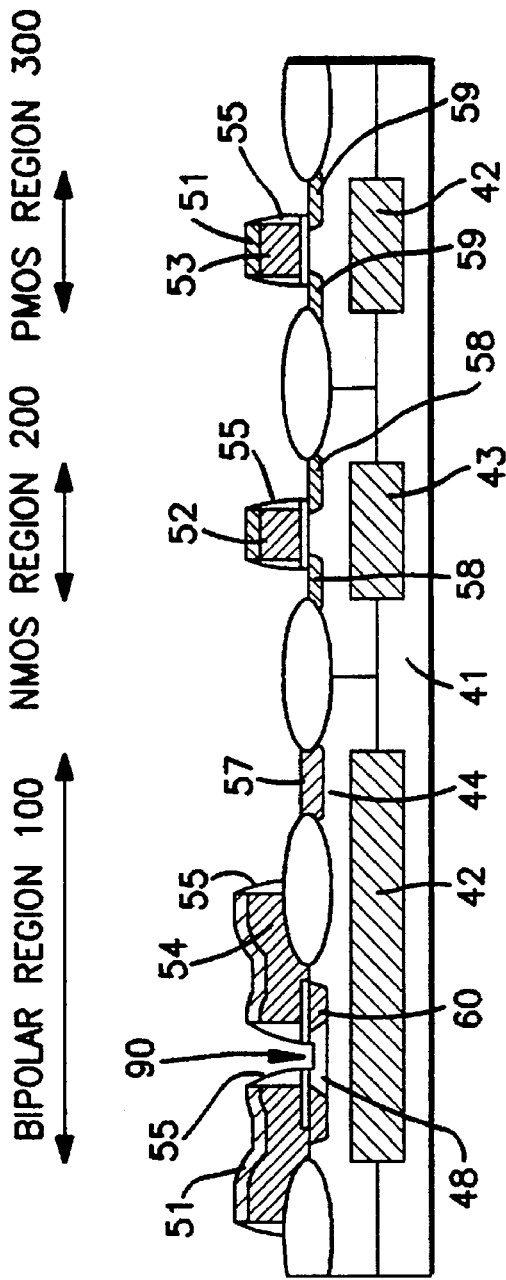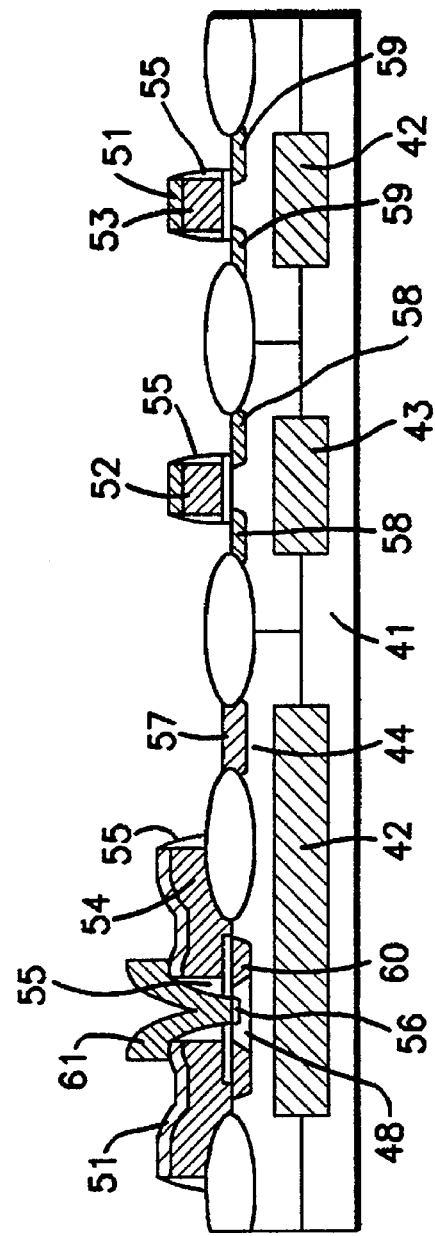
FIG. 7C PRIOR ART
FIG. 7D PRIOR ART

# METHOD OF MANUFACTURING BIPOLAR TRANSISTOR HAVING EMITTER REGION AND EXTERNAL BASE REGION FORMED IN SELF ALIGNMENT MANNER

BACKGROUND OF THE INVENTION

1. Field of the Invention

This invention relates to a method of manufacturing a bipolar transistor and, more particularly, to a manufacturing method for such a bipolar transistor that has an emitter region and an external or graft base region formed in a self alignment manner.

2. Description of the Related Art

A bipolar transistor can be enhanced in device performances such as a current gain and a response speed by forming the external base region at a precise position with respect to the emitter region. For this purpose, such a method has been proposed that forms the emitter region and the external base region in a self alignment manner with each other. This method will be described below with reference to FIG. 6A to FIG. 6D.

In a step of FIG. 6A, a field oxide film 47 is selectively formed on a collector region 44 by using a selectively oxidizing method. The portion of the collector region 44 which is not covered with the oxide film 47 define a base formation portion.

In a step of FIG. 6B, a polysilicon film 50 is formed on the entire surface and then boron ions are implanted to the polysilicon film 50. Thereafter, an oxide film 51 is formed on the polysilicon film 50.

In a step of FIG. 6C, the oxide film 51 and the polysilicon film 50 are etched in that order by an anisotropic etching technique to form an opening section 80, thereby exposing a part of the collector region 44.

In a step of FIG. 6D, boron ions are injected to the exposed part of the collector region 44 to form an intrinsic or active base region 48. A side wall made of silicon oxide 55 is then formed on a side surface of the polysilicon film 50 that forms the opening section 80. A polycrystalline layer doped with arsenic is thereafter deposited over the entire surface, followed by patterning to form a polysilicon emitter electrode 61. A thermal treatment is then conducted to have arsenic diffuse from the emitter electrode 61 into the base region 48 to form an emitter region 56. Simultaneously with this heat treatment, boron is diffused from the polysilicon layer 50 into the collector region 44 to thereby form an external or graft base region 60. Thus, the external base region 60 is formed in a self alignment manner with the emitter region 56.

However, in the method as described above, a surface portion of the collector region 44 is considerably etched away in the step of forming the opening section 80, as shown in FIG. 6C. This is because the polysilicon film 50 varies in thickness and hence a relatively excessive etching is required to completely expose the part of the collector region 44. For this reason, the base region 48 is in slight contact with the external base region 60, as shown in FIG. 6D, resulting in increase in a base resistance which deteriorates the high frequency performance. In the worst case, the base region 48 has no contact with the external base region 60. In addition, the surface portion of the collector region 44 is exposed or subjected directly to the anisotropic etching, in the step of FIG. 6C, and hence the base and emitter regions 48 and 56 formed thereat has many crystal defects, which increases leakage current.

In order to avoid the above problems, therefore, such a method that employs an oxide film as an etching stop film is disclosed in Japanese Laid-open Patent Application No. Sho 63-214663. This method is applied to produce the so-called Bi-CMOS device including a bipolar transistor and complementary MOS transistor and will be described below with reference to FIGS. 7A to 7D.

In a step of FIG. 7A, in a bipolar region 100 where bipolar transistor is to be fabricated, an $N^+$ type buried layer 42 is embedded or buried between a part of a P type silicon substrate 41 and an $N^-$ type epitaxial layer 44. In an NMOS region 200 where an N channel MOS transistor is to be fabricated, a $P^+$ type buried region 43 is formed between the silicon substrate 41 and a P well 45. In a PMOS region 300 where a P channel MOS transistor is to be fabricated, an $N^+$ type buried region 42 is formed between the substrate 41 and an N well 46, a field oxide film 47 is thereafter formed in the epitaxial layer 44, the P well 45, and the N well 46 using the selective oxidizing method to define the respective active regions of the PMOS region 300, the NMOS region 200, and the bipolar transistor region 100. In the bipolar region 100, thereafter, a P type intrinsic base region 48 is formed by selective-implantation of boron ions. Subsequently, silicon oxide films 49 is formed on the respective active regions. The films 49 serve as gate insulating films for MOS transistors.

In a step of FIG. 7B, the silicon oxide film 49 on the intrinsic base region 48 is selectively removed with a photolithography to form an opening section 49A for an external base contact. A P type polycrystalline silicon film 50 and a silicon dioxide film 51 are then sequentially formed on an entire surface. The polysilicon film 50 is doped with P-type impurities.

In a step of FIG. 7C, the silicon dioxide film 51 and the polycrystalline film 50 are selectively etched by the photolithography to form a base electrode 54, which is contact with the P type intrinsic base region 48 through the opening section 49A, and gate electrodes 52 and 53 for N-channel and P-channel MOS transistors. A silicon dioxide film is then formed on an entire surface, followed by the so-called etch-back to form side walls 55 on the respective side surfaces of the base electrode 54 and the gate electrodes 52 and 53. In this etch-back process, the portions of the silicon dioxide film 49 are also removed, as shown to expose respective parts of the P type intrinsic base region 48, the $N^-$ type epitaxial layer 44, the P well 45, and the N well 46. In particular, a hole 90 defines an emitter region. Thereafter, N type impurities such as arsenic (As) are selectively implanted to form an emitter region 56, a collector contact region 57 and source and drain regions 58 of the N channel MOS transistor. Subsequently, P type impurities such as boron (B) are selectively implanted to form source and drain regions 59 of the P channel MOS transistor. During the annealing processes for activating the implanted impurities, the P type impurities included in the base region 54 are diffused into the P type intrinsic base region 48 through the opening section 49A to thereby form a $P^+$ type external base region 60.

In a step of FIG. 7D, an N-type polycrystalline silicon layer is formed, followed by being patterned to form an emitter electrode 61.

In the bipolar transistor manufactured by the foregoing method, the silicon oxide film 49 serves as an etching stop for the collector 44 upon etching the polysilicon layer 50. Accordingly, the problems as discussed in the method of FIG. 6 are solved.

However, as is apparent from FIGS. 7B and 7C, the hole 49A for forming the external base region 60 and the hole 70 for forming the emitter region 56 are provided in separate steps from each other. For this reason, the distance between the external base region 60 and the emitter region 56 is affected by the respective photolithography processes and thus deviated from the designed value. In other words, the external base region 60 and the emitter region 56 are not formed in a self-aligned manner. The bipolar transistor is thus inferior in electrical characteristics to that shown in FIG. 6.

SUMMARY OF THE INVENTION

Accordingly, it is an object of the present invention to provide an improved method of manufacturing a bipolar transistor having an external base region and an emitter region formed in a self alignment manner.

It is another object of the present invention to provide a method of manufacturing a Bi-CMOS device including a bipolar transistor and CMOS transistors with the reduced steps in number and enhance device performances.

A method of manufacturing a bipolar transistor according to the present invention comprises the steps of forming an insulating film on a collector region, forming a first semiconductor film on said insulating film, selectively removing said first semiconductor film to form an opening section, removing an exposed portion of said insulating film by said opening section and its peripheral portion of said insulating film under said first semiconductor film, to expose a first portion of said collector region facing to said opening section and a second portion thereof facing to said peripheral portion, filling a space surrounding by said peripheral portion with a second semiconductor film, forming an intrinsic base region in said first portion, forming a side wall on a side surface of said first semiconductor film constituting said opening portion, injecting impurities to said second portion via first and second semiconductor films to form an external base region, and forming an emitter region in said first portion, which is exposed against said side wall.

In a method of manufacturing a Bi-CMOS transistor according to the present invention, during manufacturing of the bipolar transistor, the CMOS transistor is covered with a protecting film such that it is not affected by a manufacture of the bipolar transistor.

In the bipolar transistor of the present invention, a silicon oxide film, a polycrystalline silicon film, and a silicon nitride film are formed on a collector region formed in a semiconductor substrate. The silicon nitride film and the polycrystalline film are etched by using a dry etching to form an opening section. Because an etching rate of the polycrystalline film is different from that of the silicon oxide film, the silicon oxide film is almost not etched. Thereafter, the silicon oxide film is etched by a wet etching of an isotropic etching to form a concentric cavity to the opening section, located between the polycrystalline film and the collector region. Further, the cavity is filled with a polycrystalline film. The resultant structure is thermally treated, thereby diffusing the impurities into a part of the collector region contacting with this polycrystalline silicon film in the cavity to form an external base region. In addition, forming of an emitter region is controlled by a side wall. Because of the above-mentioned manufacturing method, the external base region and the emitter region are formed in a self aligned manner so that they are formed at normal positions without deviation from them.

In addition, while a series of processes for forming the external base region and the emitter region of the bipolar transistor in a self aligned manner is being carried out, a CMOS formation region is covered with protecting films, i.e., a first silicon film and a second insulating film, to be protected. The series of these processes do not affect the CMOS transistor and its manufacturing.

BRIEF DESCRIPTION OF THE DRAWINGS

The above and other objects, advantages and features of the present invention will be more apparent from the following description taken in conjunction with the accompanying drawings, in which:

FIGS. 4A to 4L are cross sectional views showing a method of manufacturing a bipolar transistor having a self alignment type external base using a Bi CMOS transistor according to the third embodiment of the present invention;

FIGS. 5A to 5C are cross sectional views showing a method of manufacturing a bipolar transistor having a self alignment type external base using a BiCMOS transistor according to the fourth embodiment of the present invention;

FIGS. 7A to 7D are cross sectional views showing a method of manufacturing a BiCMOS transistor of another prior art.

DETAILED DESCRIPTION OF THE PREFERRED EMBODIMENTS

Figure 1A:
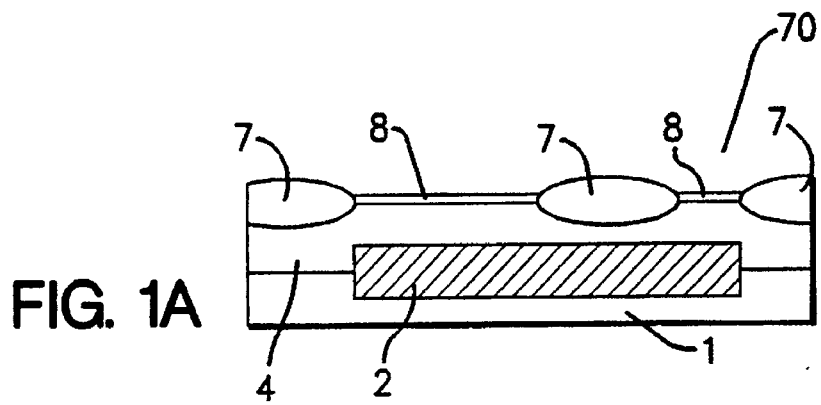
FIGS. 1A to 1L are cross sectional views showing respective steps of a method of manufacturing a bipolar transistor according to a first embodiment of the present invention.

Referring now to FIGS. 1A to FIG. 1L, a bipolar transistor according to the first embodiment of the present invention is fabricated as follows:

More specifically, in a step of FIG. 1A, an $N^+$ type buried layer 2 is selectively formed on a P type silicon substrate 1. Subsequently, an $N^-$ type epitaxial layer 4 of a thickness of 0.5 to 1.8 μm and an impurity concentration of $5\times10^{15}$ to $5\times10^{16}$ cm$^{-3}$ is formed on the $N^+$ type buried layer 2 and the substrate 1 as a collector region. A field oxide film 7 is then selectively formed on the epitaxial layer 4 using a selective oxidizing method to define a base and emitter formation portion and a collector contact formation portion. These portions are then covered with a silicon oxide film 8 of a thickness of 3 to 30 nm.

Figure 1B:
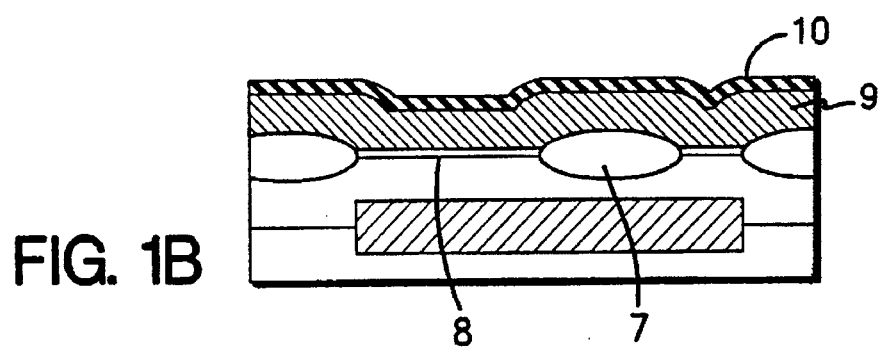

In a step of FIG. 1B, a non doped polycrystalline silicon film 9 and a silicon nitride film 10 are sequentially formed on the entire surface.

Figure 1C:
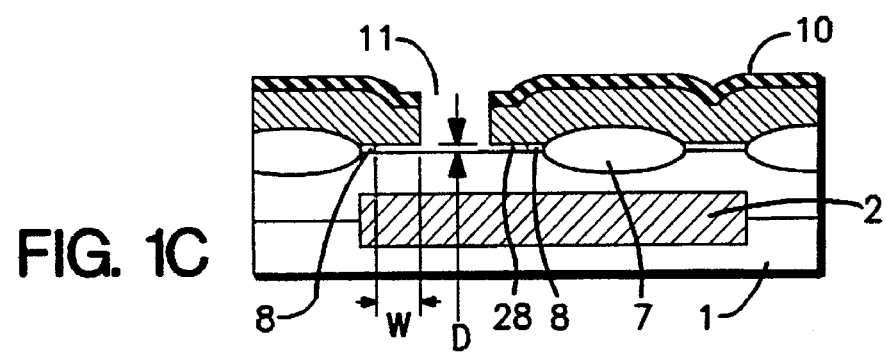

In a step of FIG. 1C, the silicon nitride film 10 is selectively removed and the first polycrystalline silicon film 9 is then selectively removed by dry etching techniques by using the remaining nitride film 10 as a mask. As a result, an opening section 11 for an intrinsic or active base region is formed above the center portion of the collector region 4 in which an intrinsic base region is to be formed later. At this time, since the silicon oxide film 8 is present to cover the collector region and thus serve as an etch stop, the collector region 4 is not etched away. Thereafter, by a wet etching technique, the silicon oxide film 8 is removed using the layer 9 as a mask. The etching of the film 8 proceeds by performing a side-etch. As a result, a cavity 28 concentric to the opening 11 is formed, with an area larger than the opening 11. Note that the silicon oxide film 8 is not entirely removed for the purpose of preventing the field oxide film 7 from being etched due to further etching of the silicon oxide film 8.

Since the oxide film 8 is thin and the etchant for the oxide film 8 hardly etches the silicon layer, the collector region 4 is not substantially etched. Moreover, no substantial crystal defects occurs. The height D and a distance W of the cavity 28 should be preferably 3 to 100 nm and 60 to 400 nm, respectively.

Further, the value W decides an area of an external base region formed in a process to be performed later in a self alignment manner. When it is too large, it leads to an increase in a base capacitance due to an increase in the area of the base region. On the contrary, when it is too small, it leads to an increase in a base resistance.

Figure 1D:
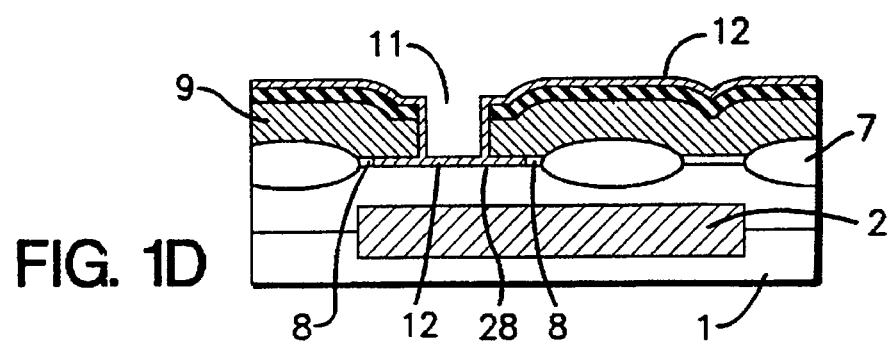

In a step of FIG. 1D, a non-doped polycrystalline silicon film 12 is deposited by the CVD process over the entire surface with filling the cavity 28. This polycrystalline silicon film 12 has a thickness substantially equal to the height D of the cavity 28. If desired, the thickness of the film 12 can be somewhat thicker than the height D.

Figure 1E:
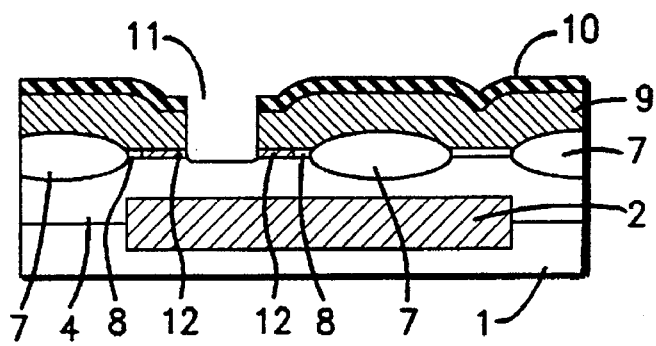

In a step of FIG. 1E, an isotropic dry etching is carried out to remove the second polycrystalline silicon film 12 except a portion thereof filling the cavity 28. The etching amount depends on the thickness of the polycrystalline silicon film 12. For example, when the height (thickness) D of the cavity 28 is 10 nm, the amount of the etched second polycrystalline silicon film 12 is 7 nm+2.1 to 7 nm+3.5 (30% to 50%). Thus, the collector region 4 is etched by 2.1 to 3.5 nm. This amount is very slight. Moreover, since the film 12 is thin, the isotropic dry etching scarcely damages the collector region 4 compared to the anisotropic dry etching.

Figure 1F:
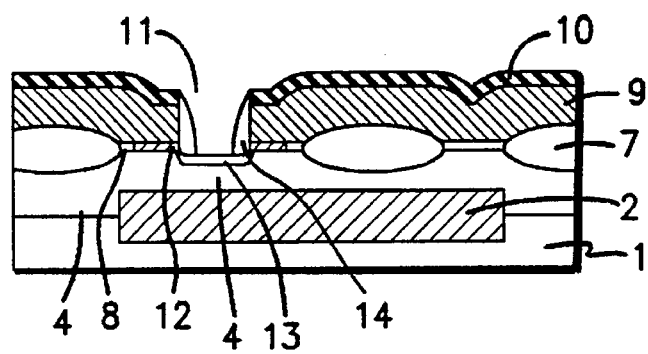

Next, in a step of FIG. 1F, boron or boron fluoride ($BF_2$) ions are ion-implanted into the collector region 4 by using the films 9 and 10 as a mask, followed by annealing to activate the implanted ions. Thus, a P-type intrinsic base region 13 is formed in the collector region 4. Subsequently, a silicon oxide film is deposited over the entire surface, and an anisotropic dry etching is carried out. Side wall spacers 14 are thereby formed.

Figure 1G:
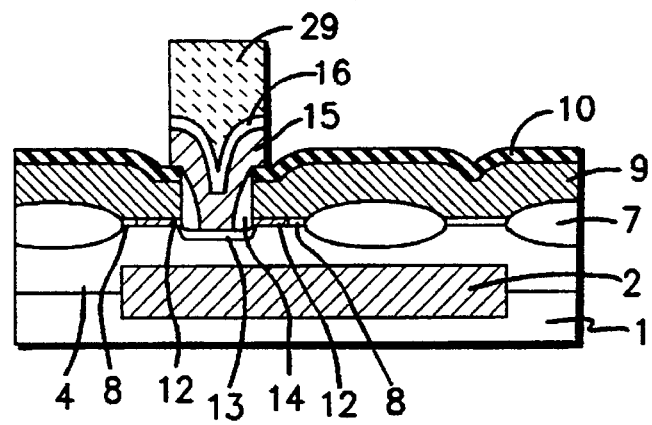

In a step of FIG. 1G, a polycrystalline silicon film 15 doped with N type impurities such as arsenic on the entire surface, and a silicon oxide film 16 is then formed thereon. Patterning process is then performed by using a photoresist 29 to thereby form an $N^+$ type emitter electrode 15.

Figure 1H:
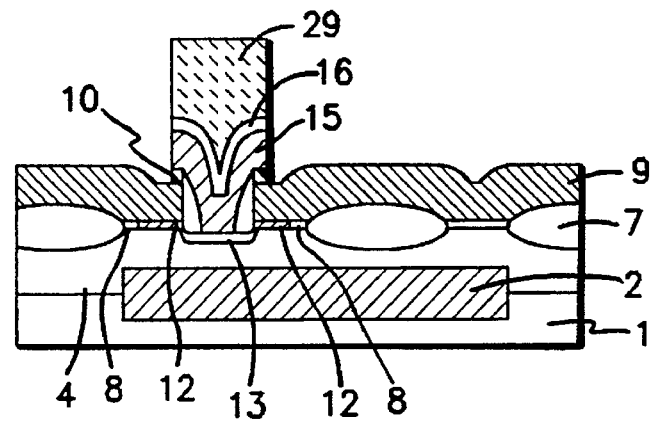

In a step of FIG. 1H, the silicon nitride film 10 is etched by using again the photoresist 29 as a mask to expose the polycrystalline silicon film 9.

Figure 1I:
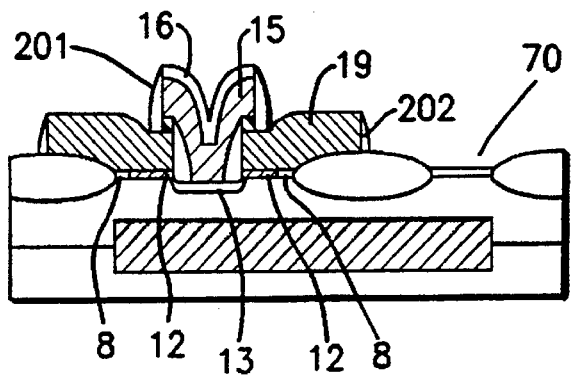

In a step of FIG. 1I, the first polycrystalline silicon film 9 is etched with the dry etching technique using the photoresist as a mask. Hence, a base electrode 19 is formed. Subsequently, a silicon oxide film is deposited on the entire surface, followed by the anisotropic dry etching to form second and third side walls 201 and 202 on the respective side surfaces of the emitter electrode 15 and base electrode 19.

Figure 1J:
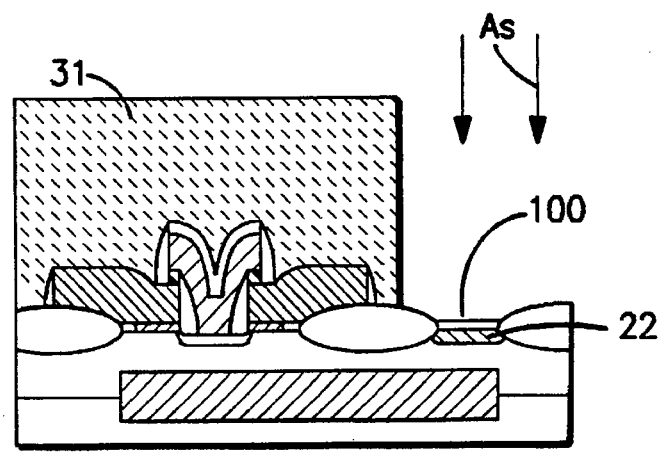

In a step of FIG. 1J, N type impurities such as arsenic are ion-implanted with a mask 31 at an energy of 30 to 50 keV and with doping amount of $2 \times 10^{15}$ to $5 \times 10^{15}$ $cm^{-3}$. A collector contact region 22 is thereby formed.

Figure 1K:
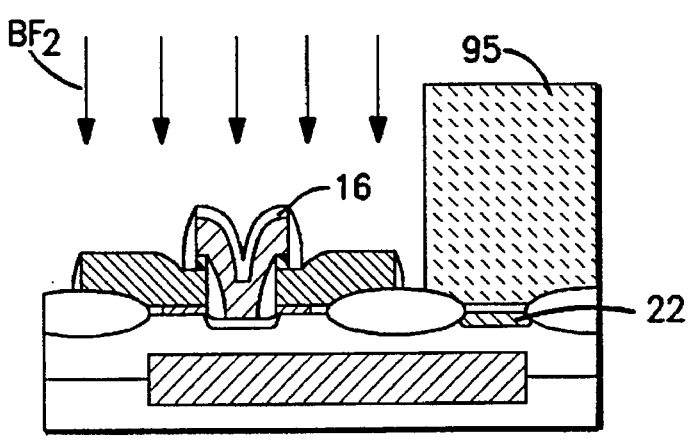

In a step of FIG. 1K, after a mask 35 is formed to cover the collector contact region 22, P type impurities such as $BF_2$ are ion-implanted into the base polysilicon electrode 19 at an energy of 30 to 50 keV to have an impurity concentration of $2 \times 10^{15}$ to $5 \times 10^{15}$ $cm^{-3}$. At this time, the silicon oxide film 16 keeps the P-type impurities from being doped into the $N^+$ type emitter electrode 15, so that an increase in an emitter resistance is not caused.

Figure 1L:
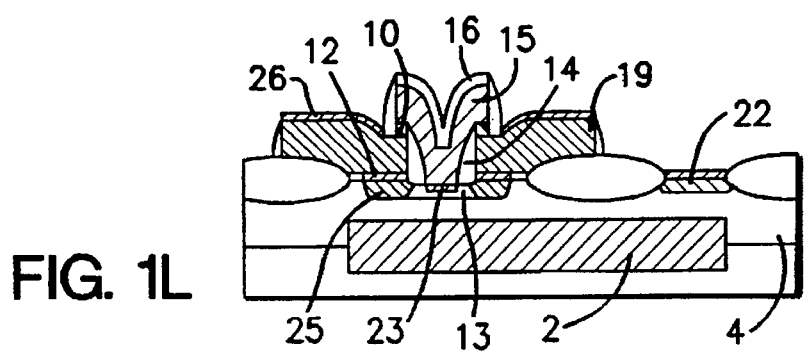

In a step of FIG. 1L, a thermal treatment using a furnace heated by resistor heater is carried out at a temperature of 850° to 900° C. for 10 to 30 min. Hence the base electrode 19 is converted to the P type. Further, a part of impurities contained in the electrode 19 diffused into the second polycrystalline silicon film 12 to convert it into the P type and further into the collector and base regions 4 and 13 to form, an external base region 25. During this heat treatment, further, an $N^+$ type emitter region 23 is formed by diffusion of the impurities from the emitter electrode 15.

Thereafter, a titanium film of a thickness of 20 to 70 nm is formed by sputtering, followed by thermal process to form a titanium silicide layer 26 on the base electrode 19. With this titanium silicide layer 26, each electrode is reduced in resistance.

Figure 2:
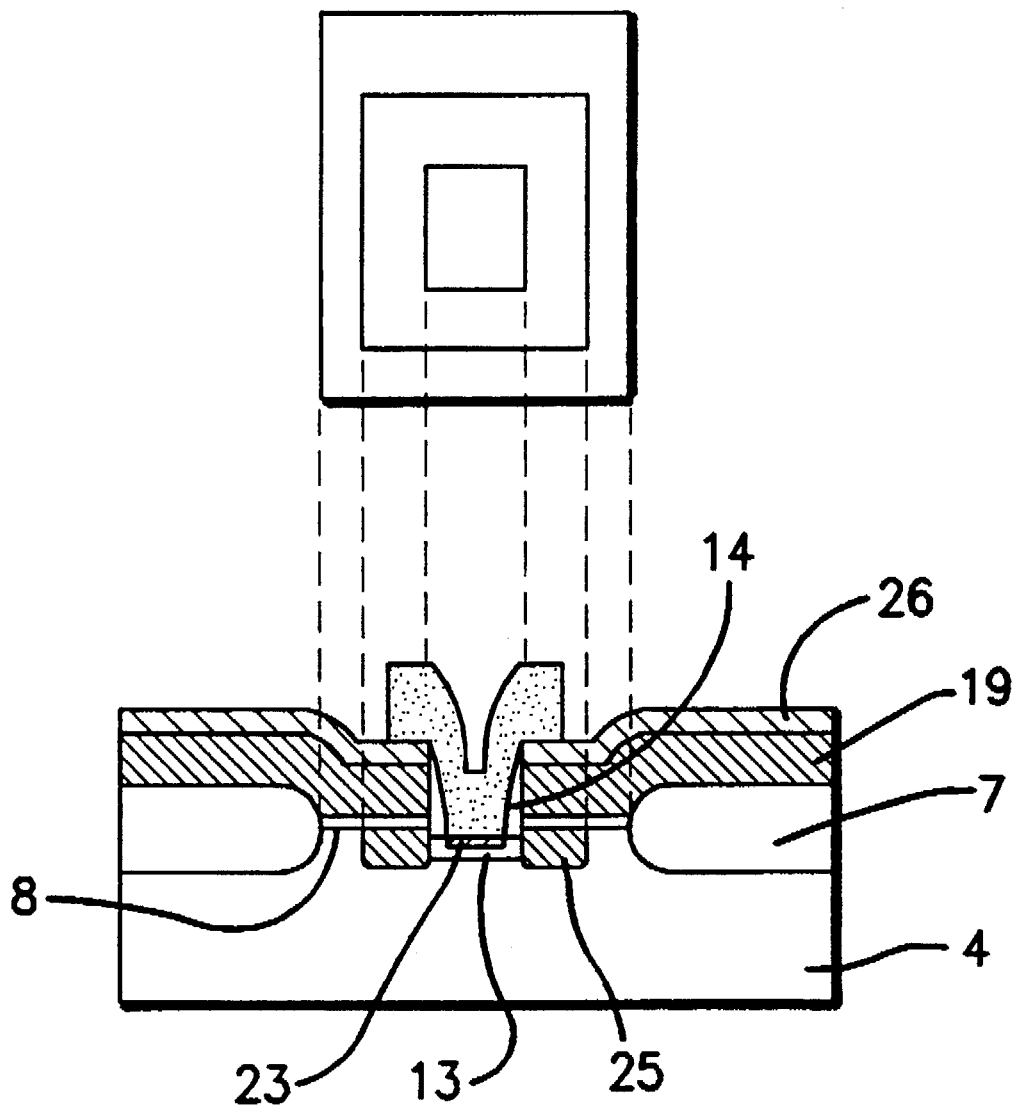
FIG. 2 is a sectional view of the bipolar transistor shown in FIGS. 1A to 1L accompanied with its plan view.

FIG. 2 is a plan view of the bipolar transistor shown in FIGS. 1A to 1L and a sectional view corresponding to the plan view. In FIG. 2, the silicon oxide film 8, the external base region 25, the field insulating film 7, and the base electrode 13 have a ring-like shape. Note that the substrate 1 and the buried region 2 are omitted in FIG. 2.

According to the method as described above, the emitter region 23 and the external base region 25 are formed in a self-aligned manner. Moreover, a slight etching occurs on the collector region 4 upon forming the opening 11. Accordingly, the base region 23 is in contact with the external base region 25 with a large area to thereby decrease a base resistance.

Figure 3A:
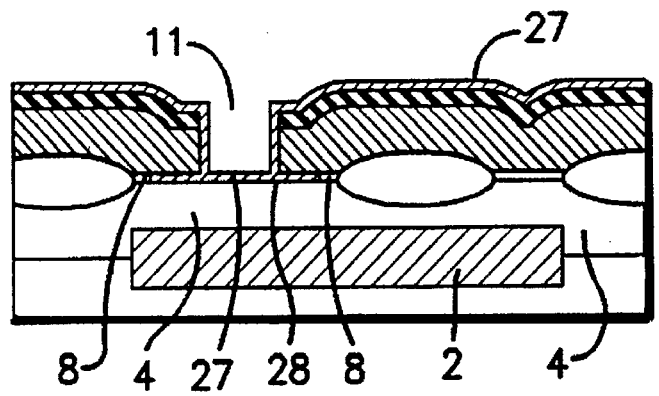
FIGS. 3A to 3C are cross sectional views showing steps of a method of manufacturing a bipolar transistor having a self alignment type external base according to a second embodiment of the present invention.
Figure 3B:
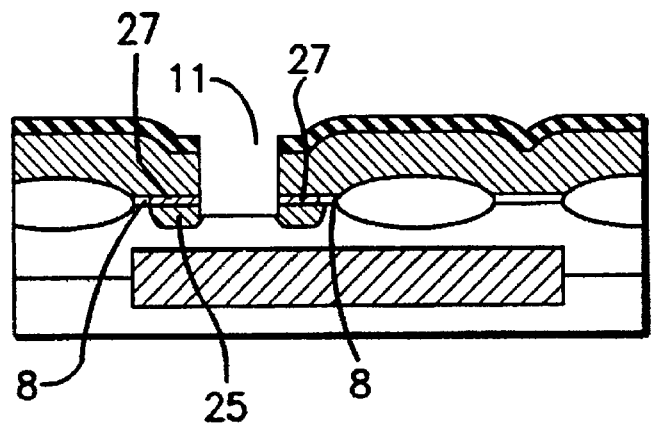

Turning to FIG. 3, there is shown a method according to the second embodiment of the present invention, in which the same constituents as those shown in FIG. 1 are denoted by the same reference numerals to omit the further description thereof. In this embodiment, after the steps of FIGS. 1A to 1C of the first embodiment, as shown in FIG. 3A, a film 27 formed of a boron-doped polycrystalline silicon or a boron-doped amorphous silicon is formed on the entire surface with filling the cavity 28. The polycrystalline silicon film 27 is removed by an isotropic dry etching technique except the portion thereof filling the cavity 28, as shown in FIG. 3B. Subsequently, the external base region 25 is formed by annealing, i.e., by the diffusion of boron from the remaining film 27.

Figure 3C:
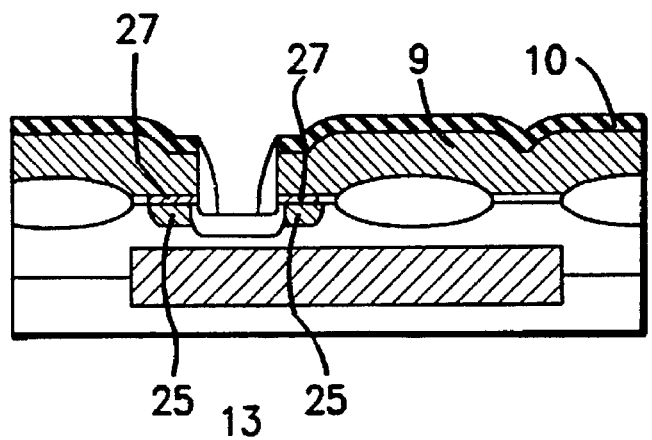

In a step of FIG. 3C, either boron or $BF_2$ ions are implanted into the collector region 4, followed by a thermal treatment for activation, so that a P type intrinsic base region 13 is formed in contact with the external base region 25. After this, the other regions are formed in a manner as shown in FIG. 1.

In the methods shown in FIGS. 1 and 3, the polysilicon film 19 may be previously doped with impurities.

Referring to FIG. 4, there is shown a method of fabricating a Bi-CMOS device employing the present invention.

Figure 4A:
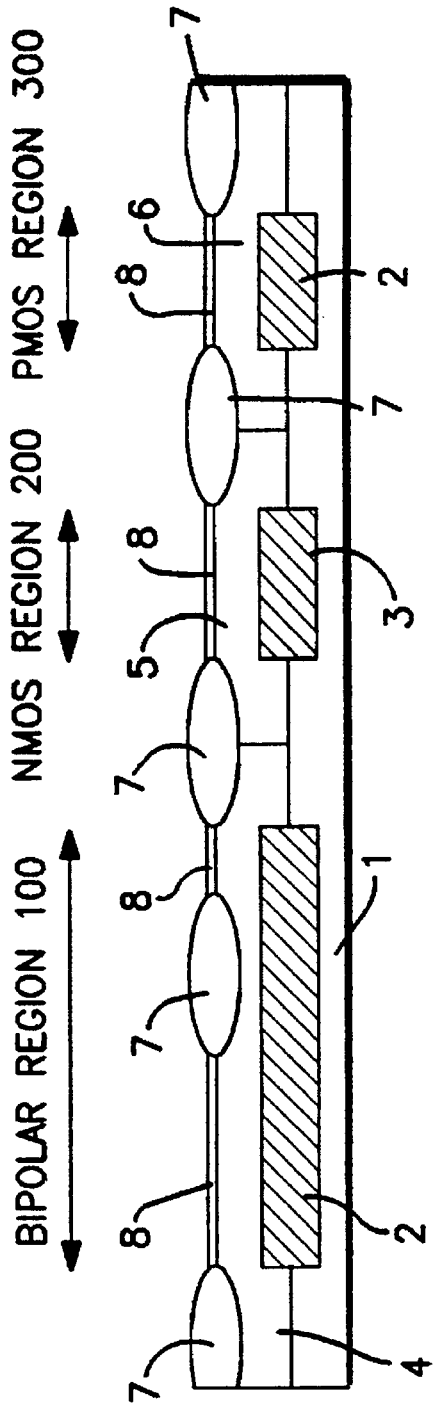
Figure 4B:
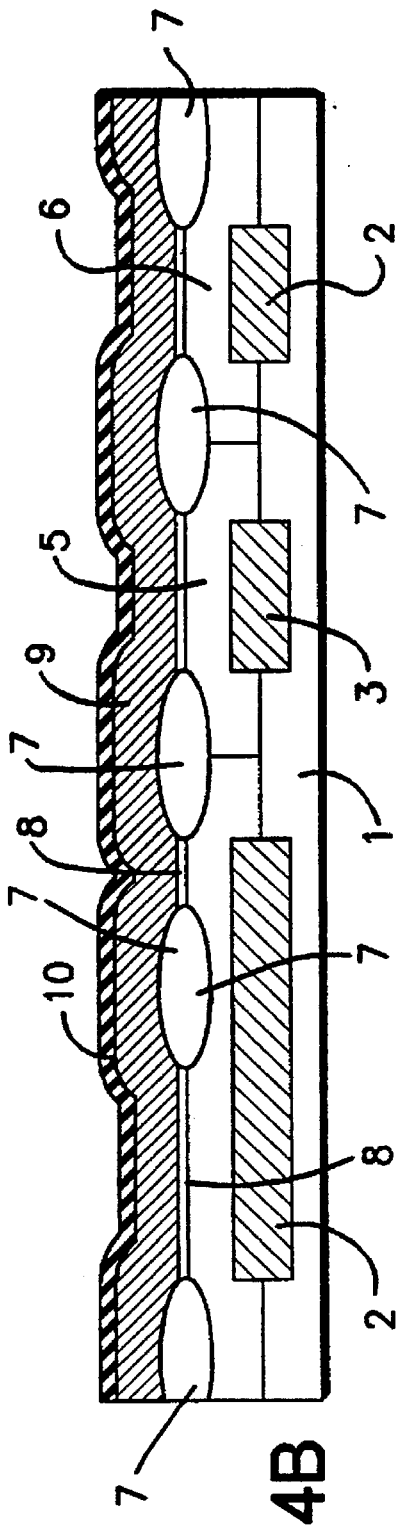
Figure 4G:
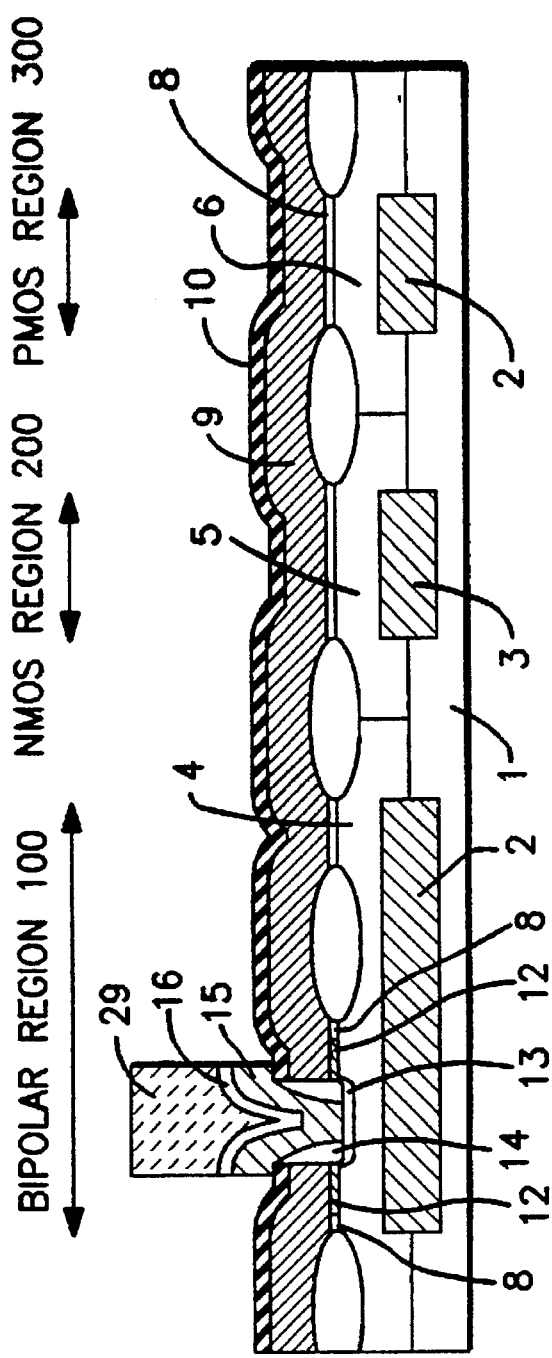

More specifically in a step of FIG. 4A, arsenic or antimony ions are selectively implanted into regions a bipolar region 100 and a P channel MOS region 300 in a P type silicon substrate 1 to form an $N^+$ type buried region 2. Boron ions are implanted into an N channel MOS region 200 to form a $P^+$ type buried region 3. Subsequently, an $N^-$ type epitaxial layer 4 of a thickness of 0.5 to 1.8 μm having an impurity concentration of $5 \times 10^{15}$ to $5 \times 10^{16}$ $cm^{-3}$ is formed on the N⁺ type buried layer 2 and substrate 1 as a collector region. After P well 5 and n well 6 are formed in NMOS Region 200 and P MOS Region 300, respectively, a field oxide film 7 is then selectively formed by using a selective oxide method. With this field oxide film 7, the bipolar transistor region 100, the N channel MOS transistor region 200, and the P channel MOS transistor region 300 are separated from each other. Thereafter, these portions are then covered with a silicon oxide film 8 serving as a gate insulating film in the N and P channel MOS transistors which has a thickness of 3 to 30 nm.

Subsequently, steps of FIGS. 4B to 4G are the same as those of FIGS. 1B and 1F.

In etching steps performed shown in FIGS. 4B to 4G a silicon nitride film 10 and a first polycrystalline silicon film 9 cover the N and P channel MOS transistor regions 200, 300 to protect the gate insulating film 8 and a first polycrystalline silicon film 9 from dry etching 2 and introduction of impurities. The reason is that the above described etching steps should be carried out under the condition wherein the silicon nitride film 10 and the polycrystalline silicon film 9 are not substantially etched.

Figure 4H:
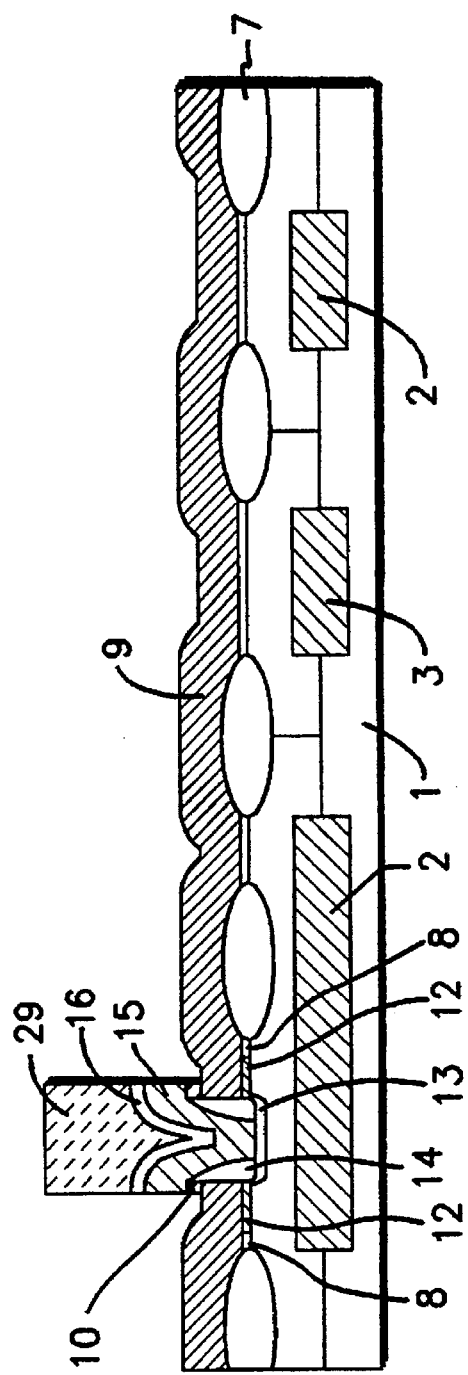

In a step of FIG. 4H, the silicon nitride film 10 is etched by using the photoresist 29 again as a mask to expose the first polycrystalline silicon film 9.

Figure 4I:
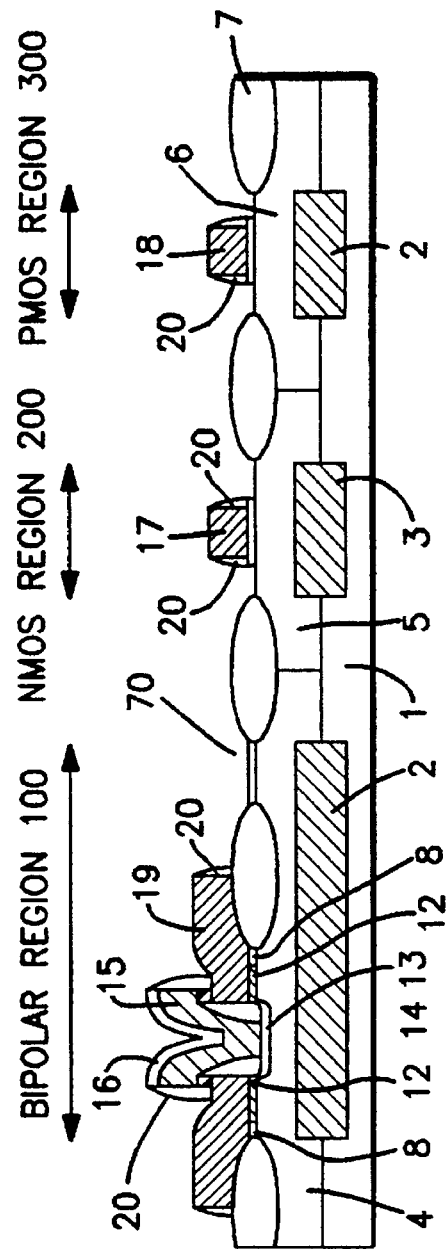

Subsequently, in a step of FIG. 4I, through steps of photoresist patterning and dry etching for the first polycrystalline silicon film 9, a base electrode 19 is formed in the bipolar transistor region 100. At the same time, gate electrodes 17 and 18 of N and P channel MOS transistors are formed in the N and P channel MOS transistor regions 200,300, respectively. Following this step, after a silicon oxide film is deposited on the entire surface followed by the anisotropic dry etching to form second side wallspacers 20 on each of side surfaces of the polycrystalline silicon electrodes 17, 18, 19. Prior to forming the second side wallspacers 20, a lightly doped drain (LDD) regions may be formed in the N and PMOS transistor regions 200,300, respectively. The LDD region is a means for forming a low impurity concentration region in the N and P well regions under the side wallspacers 20. As an impurity introduced into the LDD region of the N channel MOS transistor region 200, phosphorus (As) is used. A provision of the LDD regions prevents effectively hot carriers from occurring.

Figure 4J:
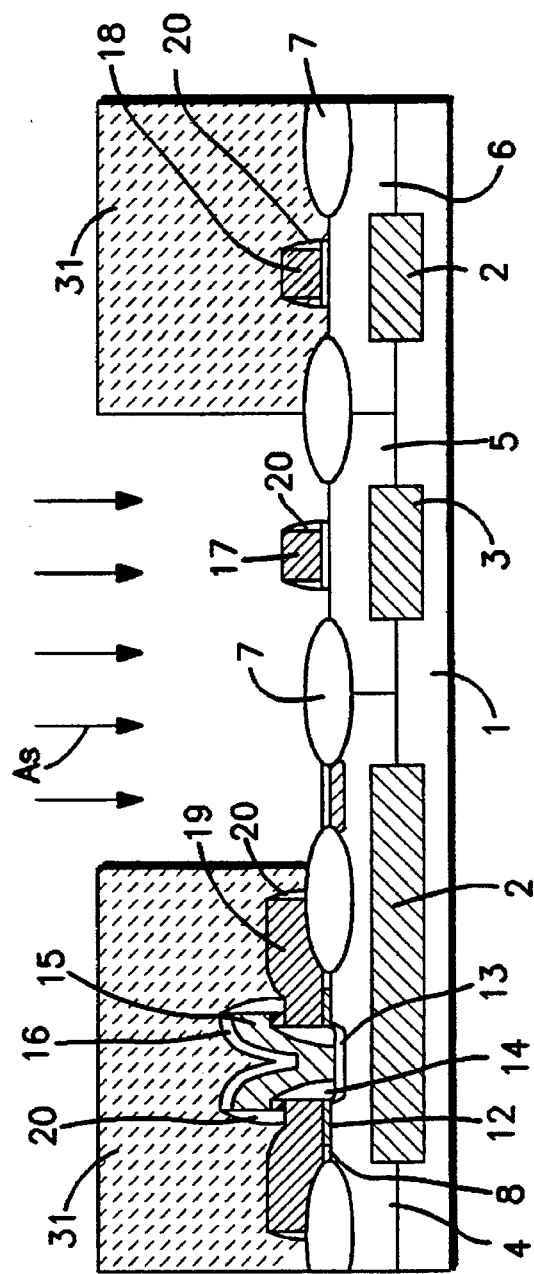

In a step of FIG. 4J, the bipolar region 100 and the P MOS region 300 are masked with a photoresist 31, N type impurities, such as arsenic, are ion-implanted to the N MOS region 200 and a collector drawn out region 70 of the bipolar region 100, at an energy of 30 to 50 keV and with doping amount of $2 \times 10^{15}$ to $5 \times 10^{15}$ cm⁻³

In a step of FIG. 4K, after the N channel MOS transistor region 200 and the collector drawn out region 70 are masked by a photoresist 32, P type impurities such as (BF₂) ions are ion-implanted to the base polysilicon electrode 19 and the P MOS region 300, at an energy of 30 to 50 keV and with doping amount of $2 \times 10^{15}$ to $5 \times 10^{15}$ $^{cm-3}$. At the time of ion implanting of the BF₂, since the silicon oxide film 16 is present on the N type emitter electrode 15, an increase in an emitter resistance due to the introduction of the P type impurities to the emitter electrode 15 is not caused.

In a step of FIG. 4L, with resistor-heating in a thermal treatment path, at a temperature of 850° to 900° C. and for 10 to 30 minutes, a source/drain region 21 of the N channel MOS transistor and an N type collector drawn region 22 are formed. At the same time, the gate electrode 17 is converted to N⁺ type one. In addition, a source/drain region 24 of the P channel MOS transistor is formed, and the base electrode 19 is converted to a P type one. The second polycrystalline silicon film 12 within the cavity 28 is converted to the P type one by a boron diffusion from the P type base electrode 19, and then an external base region 25 is formed by boron diffusion from the second polycrystalline silicon film 12. Moreover, a gate electrode 18 of the P channel MOS transistor is converted to a P⁺ type one, too. During this thermal treatment further, an N⁺ type emitter region 23 is formed by a diffusion of the impurities from the emitter electrode 15. In the CMOS transistor, the gate electrode 17 of the N channel MOS transistor is of the N type and the gate electrode 18 of the P channel MOS transistor is the P type. The MOS transistor has a low threshold voltage Vth, the channels of the N and P type channel MOS transistors are made to be a shallow surface channel. Therefore, both MOS transistors have channel profiles exhibiting scarcely short channel effect.

Thereafter, a titanium film of a thickness of 20 to 70 nm is formed by sputtering, followed by thermal process to form a titanium silicide layer 26 on the gate electrodes 17 and 18 and the source/drain regions 21 and 24 thereof. With this titanium silicide layer 26, each of the electrodes is reduced in resistance.

In the above embodiment, after the ion implantation of the N type impurities: arsenic and P type impurity: BF₂ shown in FIG.4J.K, the thermal treatment to activate them is done. When one of the P and N type impurities requires a higher thermal treatment temperature for activation or a higher thermal treatment temperature than the other of then is needed, after the ion implantation and thermal treatment of one of both impurities, these may be carried out for the other impurities.

Further, when only the bipolar transistor is fabricated on the semiconductor substrate, boron ions may be previously injected to a polycrystalline silicon film serving as a base electrode 19 and convert it to be a P⁺ type one. However, when fabricating the Bi-CMOS transistor, the polycrystalline silicon film 19 cannot be converted to be the P⁺ type one, because of using the polycrystalline silicon film for both of the base electrode 19 and gate electrode 17, 18. That is the reason that the base electrode 19 formed from the polycrystalline silicon film is converted to be P⁺ type one at the time of an injection of SDBF₂. Otherwise, there is a problem that boron penetrates from the P⁺ type electrode 19 of the P channel MOS transistor so that a properly sufficient thermal treatment cannot be done after the injection of SDBF₂. Hence, a formation of the external base region 25 is difficult. From the above reason, the structure of the semiconductor device of the present invention is so designed that the external base region 25 is formed by virtue of a diffusion from the polycrystalline silicon containing the boron buried in the cavity.

Accordingly a semiconductor device including a bipolar transistor and a first MOS transistor comprises the following steps. A semiconductor layer 1 is defined a collector region 4 for a bipolar transistor and a substrate region 5, 6 for a MOS transistor. The collector region 4 has a first portion and a second portion around said first portion. The collector region 4 and the substrate region 5, 6 is covered with an insulating film 8. The insulating film thereby has a first part on the collector region and a second part on said substrate region.

A first polysilicon layer 9 formed on the insulating film has an opening above the collection region. The opening has a first area. The first part of the insulating film is selectively removed with a second area that is larger than the first area to thereby expose the first and second portions of the collector regions and form a gap between the second portion of the collector region and a part of the first polysilicon layer 9. The part of the first polysilicon layer has a side surface defining the opening. The gap is filled with a silicon layer 12.

First impurities are doped into the first portion of the collector region to form an intrinsic base region 13. A side wall spacer 14 is formed on side surface of the part of the first polysilicon layer to thereby made the opening smaller than the first area. A second polysilicon layer 15 is formed in contact with the side wall spacer 14 and the intrinsic base region 13. The second polysilicon layer 15 is doped with second impurities.

The first polysilicon layer 9 is patterned to form a base electrode 19 and a gate electrode 17,18. The base electrode 19 includes the part of first polysilicon layer. The gate electrode 17,18 is formed on the second part of the insulating film. Third impurities are doped into the base electrode 19 and into the substrate region by using the gate electrode as a mask to form impurity doped regions in the substrate region. An annealing process is performed to cause the second impurities to diffuse from the second polysilicon layer into the intrinsic base region 13 to form an emitter region 23 therein, to cause the third impurities to diffuse from the base electrode 19 into the collector region through the silicon layer to form an external base region 25 in contact with the instrinsic base region 13 and cause the third impurities in the impurity-doped regions activate to form source and drain regions for the first MOS transistor.

Referring to FIG. 5, there is shown another method of fabricating Bi-CMOS device employing the present invention.

Figure 5C:
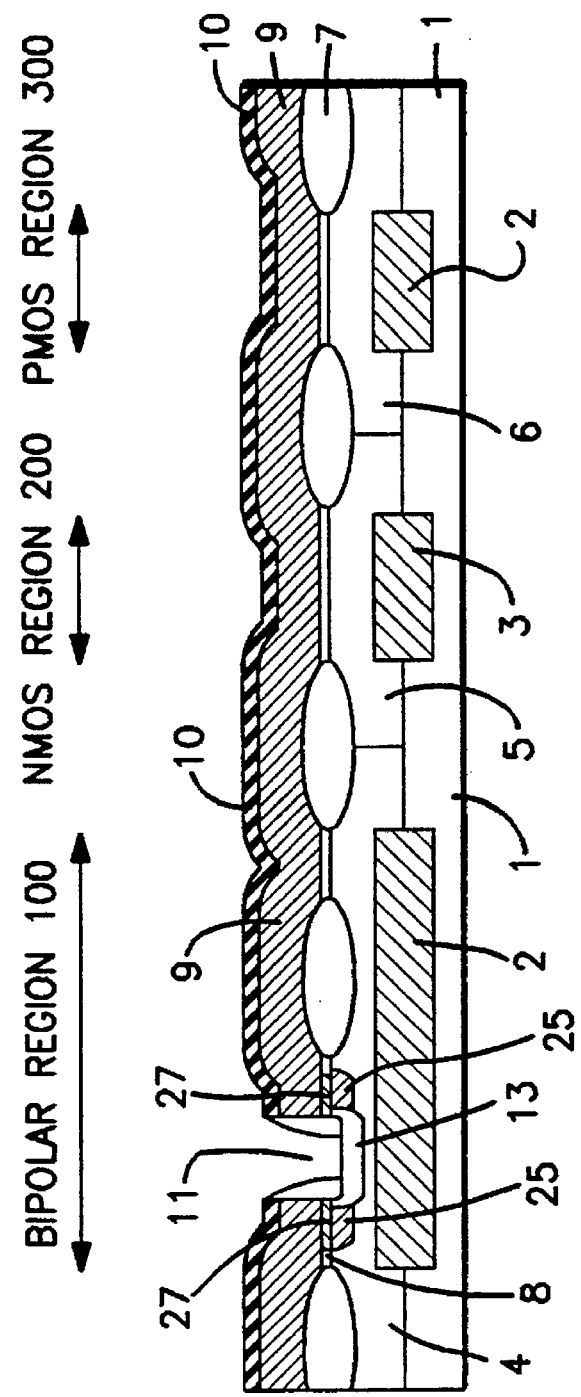
Figure 6A:
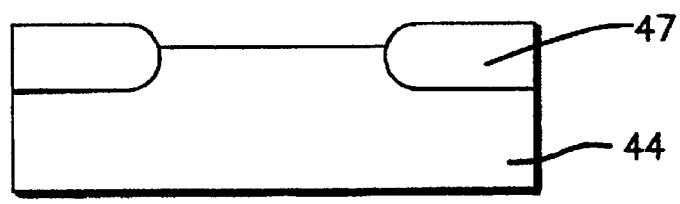
FIGS. 6A to 6D are cross sectional views showing a method of manufacturing a bipolar transistor of a prior art.
Figure 6B:
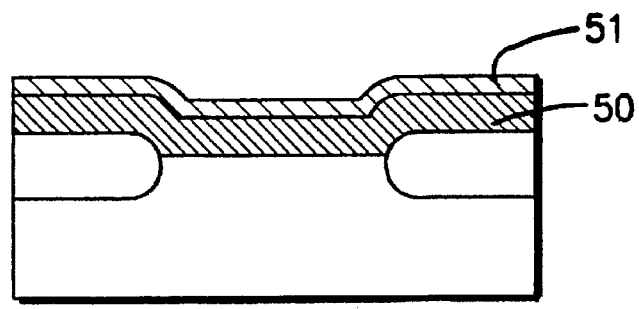
Figure 6C:
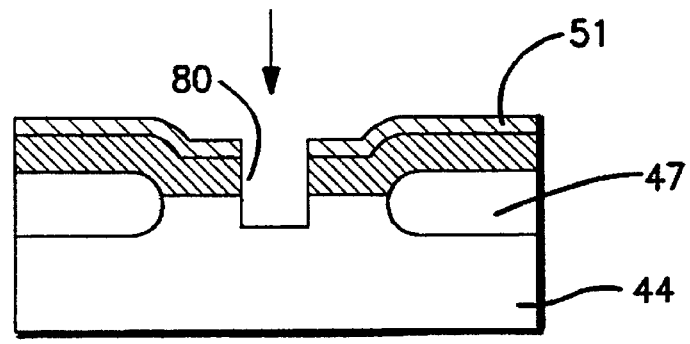
Figure 6D:
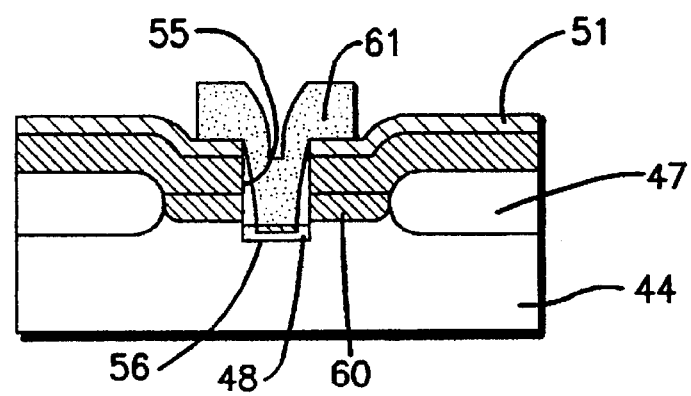
Figure 7A:
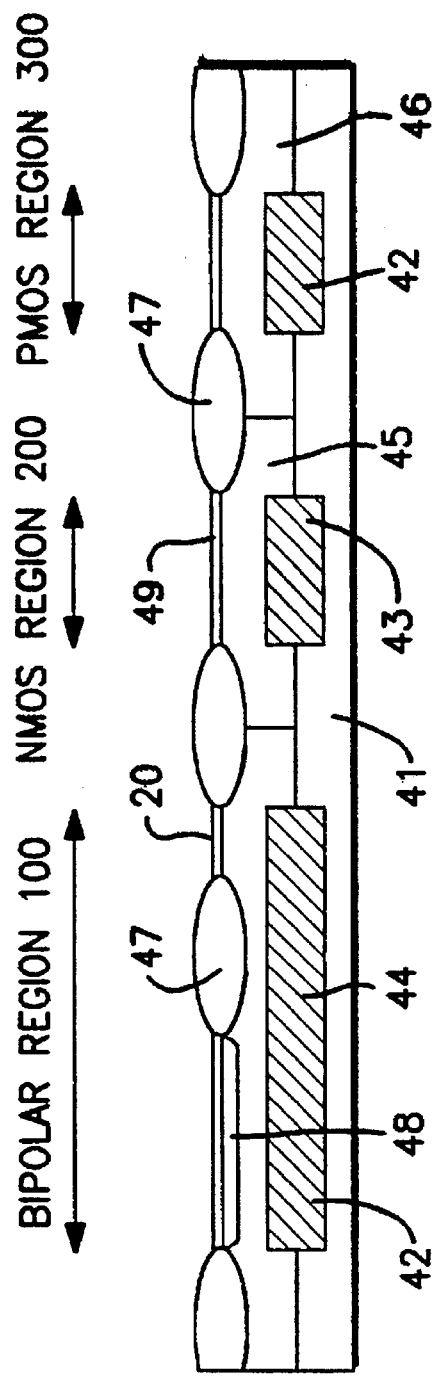
Figure 7B:
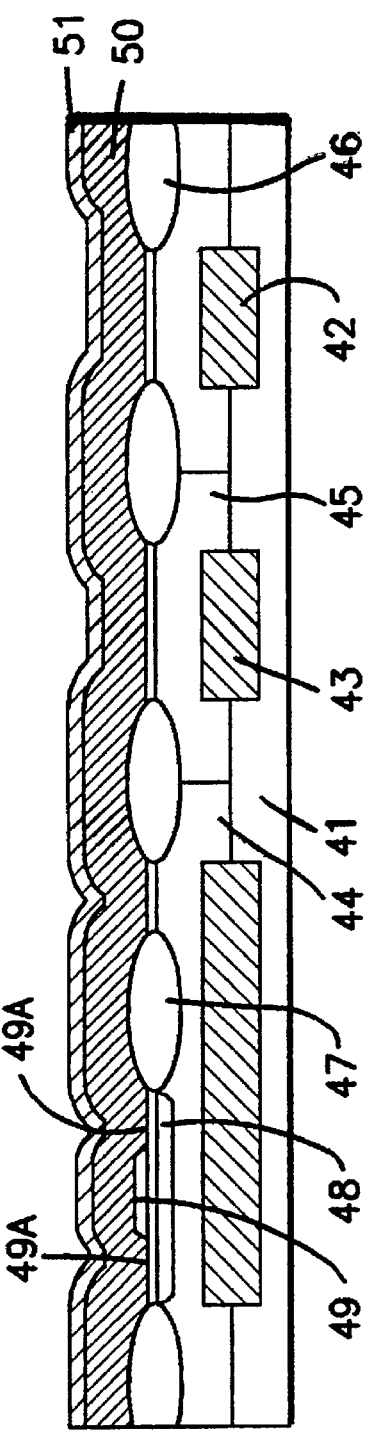

Note that FIGS. 5A, 5B, and 5C show processes corresponding to FIGS. 3A, 3B, and 3C. The same portions in FIGS. 5A, 5B, and 5C to those in FIGS. 3C, 3D and 3E are denoted with the same reference numerals, and explanations of them are omitted.

In the method of manufacturing the self alignment type bipolar transistor according to the present invention, in the step of FIG. 5B, the P⁺ type external base region 25 is formed. Therefore, if the emitter region 23 (see FIG. 4L) is formed by the thermal diffusion before the ion injection of the N and P type impurities for forming the MOS drain/source regions, the thermal treatment for activating the impurities of the MOS drain/source regions may be satisfactorily done by a lamp annealing at a temperature of 950° to 1050° C. and for 10 to 20 minutes. Or, in the case where the N and P type impurities for formation of the MOS source/drain regions are injected, after the P⁺ type external base region 25 and the emitter region 23 are formed simultaneously by heat treatment performed in a thermal treatment path using a resistance heater, etc., the lamp annealing is sufficiently useful for a heat treatment for an activation.

In recent years, with increasing miniaturization of devices, the thicknesses of gate oxide films of MOS transistors have decreased below 10 nm. When a conductivity type of a gate electrode of a P channel MOS transistor is converted to a P type by boron or $BF_2$, boron penetrates through a gate oxide film from the gate electrode and diffuses into a substrate. As a result, a channel distribution is varied thereby shifting a threshold voltage. Considering this phenomenon, if the thermal treatment for activating by annealing is used, an external base region having sufficiently lowered resistance can be formed, regardless of the penetration of boron from the gate electrode of the P channel MOS transistor.

As described above, according to the method of manufacturing the present invention, during a series of processes for forming an external base region of a bipolar transistor in a self alignment manner, a CMOS transistor formation region is covered with a first silicon film and a second insulating film to be protected. Thereafter, the first silicon film is patterned to form a gate electrode of the CMOS transistor, thereby making it able to decide a distance between the external base region and an emitter region in a self alignment manner. As a result, the bipolar transistor that values of base capacitance and base resistance vary within a narrow range can be formed without giving rise to any obstacles to manufacturing of the CMOS transistor.

Although the preferred embodiments of the present invention has been described in detail, it should be understood that various changes, substitution and alternation can be made therein without departing from the spirit and scope of the invention as defined by the appended claims.

What is claimed is:

1. A method of manufacturing a semiconductor device including a bipolar transistor and a first MOS transistor, said method comprising the steps of:

defining in a semiconductor layer a collector region for said bipolar transistor and a substrate region for said first MOS transistor, said collector region having a first portion and a second portion around said first portion;

covering said collector region and said substrate region with an insulating film, said insulating film thereby having a first part on said collector region and a second part on said substrate region;

forming on said insulating film a first polysilicon layer having an opening above said collection region, said opening having a first area;

selectively removing said first part of said insulating film with a second area that is larger than said first area to thereby expose said first and second portions of said collector regions and form a gap between said second portion of said collector region and a part of said first polysilicon layer, said part of said first polysilicon layer having a side surface defining said opening;

filling said gap with a silicon layer;

doping first impurities into said first portion of said collector region to form an intrinsic base region;

forming a side wall spacer on said side surface of said part of said first polysilicon layer to thereby made said opening smaller than said first area;

forming a second polysilicon layer in contact with said side wall spacer and said intrinsic base region, said second polysilicon layer being doped with second impurities;

patterning said first polysilicon layer to form a base electrode and a gate electrode, said base electrode including said part of said first polysilicon layer, said gate electrode being formed on said second part of said insulating film;

doping third impurities into said base electrode and into said substrate region by using said gate electrode as a mask to form impurity doped regions in said substrate region; and performing an annealing process to have said second impurities diffuse from said second polysilicon layer into said intrinsic base region to form an emitter region therein, have said third impurities diffuse from said base electrode into said collector region through said silicon layer to form an external base region in contact with said intrinsic base region and have said third impurities in said impurity doped regions activate to form source and drain regions for said first MOS transistor.

2. The method as claimed in claim 1, wherein said device further includes a second MOS transistor having a channel type opposite to a channel type of said first MOS transistor, said first polysilicon layer being patterned to further form a second gate electrode for said second MOS transistor, and said method further comprises the step of doping fourth impurities in a portion of said semiconductor layer by using said second gate electrode as a mask to form doping regions, said annealing process further having said fourth impurities in said doping region activate to form source and drain regions for said second MOS transistor.

* * * * *